US008193877B2

(12) United States Patent
Fritz et al.

(10) Patent No.: US 8,193,877 B2
(45) Date of Patent: Jun. 5, 2012

(54) DUPLEXER WITH NEGATIVE PHASE SHIFTING CIRCUIT

(75) Inventors: Martin Fritz, Munich (DE); Martin Handtmann, Munich (DE); Ji-Fuh Liang, San Jose, CA (US); Bernhard Gebauer, Beyharting (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 290 days.

(21) Appl. No.: 12/627,122

(22) Filed: Nov. 30, 2009

(65) Prior Publication Data

US 2011/0128092 A1 Jun. 2, 2011

(51) Int. Cl.
*H03H 9/64* (2006.01)
*H03H 9/68* (2006.01)

(52) U.S. Cl. ........................ 333/133; 333/193
(58) Field of Classification Search .......... 333/133, 333/187, 188, 189, 191, 192, 193, 194, 195
See application file for complete search history.

(56) References Cited

U.S. PATENT DOCUMENTS

| 3,174,122 A | 3/1965 | Fowler, et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |

(Continued)

FOREIGN PATENT DOCUMENTS

DE 10160617 6/2003

(Continued)

OTHER PUBLICATIONS

Byeoungju, Ha "Novel 1-Chip FBAR Filter for Wireless Handsets", *The 13th International Conference on Solid-State Sensors, Actuators and Microsystems*, vol. 2 Jun. 5-9, 2005, 2069-2073.

(Continued)

*Primary Examiner* — Dean O Takaoka

(57) ABSTRACT

A duplexer includes first and second acoustic filters and a phase shifter. The first acoustic filter is connected between an antenna and the transmitter, and has a first passband. The second acoustic filter is connected between the antenna and the receiver, and has a second passband. The phase shifter includes at least one series capacitor connected in series with the antenna and at least one shunt inductor connected between the at least one capacitor and ground. The phase shifter is connected between the antenna and the first filter when the first passband is higher than the second passband, and provides a negative phase shift of an output impedance of the first filter. The phase shifter is connected between the antenna and the second filter when the second passband is higher than the first passband, and provides a negative phase shift of an input impedance of the second filter.

20 Claims, 8 Drawing Sheets

U.S. PATENT DOCUMENTS

| | | |
|---|---|---|
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,705,877 A | 1/1998 | Shimada |
| 5,714,917 A | 2/1998 | Ella |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk et al. |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,369,672 B1 | 4/2002 | Ikada |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,693,500 B2 | 2/2004 | Yang et al. |

| | | |
|---|---|---|
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,842,089 B2 | 1/2005 | Lee |
| 6,853,534 B2 | 2/2005 | Williams |
| 6,873,065 B2 | 3/2005 | Haigh et al. |
| 6,873,529 B2 | 3/2005 | Ikuta et al. |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,903,631 B2 | 6/2005 | Kushitani et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,649 B2 | 8/2005 | Metzger et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,116,187 B2 | 10/2006 | Inoue |
| 7,128,941 B2 | 10/2006 | Lee |
| 7,138,889 B2 | 11/2006 | Lakin |
| 7,161,448 B2 | 1/2007 | Feng et al. |
| 7,170,215 B2 | 1/2007 | Namba et al. |
| 7,173,504 B2 | 2/2007 | Larson, III et al. |
| 7,180,467 B2 | 2/2007 | Fabrega-Sanchez et al. |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,242,270 B2 | 7/2007 | Larson, III et al. |
| 7,259,498 B2 | 8/2007 | Nakatsuka et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,289,008 B2 | 10/2007 | Kuroki et al. |
| 7,294,919 B2 | 11/2007 | Bai |
| 7,301,258 B2 | 11/2007 | Tanaka |
| 7,301,420 B2 | 11/2007 | Yamaguchi et al. |
| 7,310,861 B2 | 12/2007 | Aigner et al. |
| 7,332,985 B2 | 2/2008 | Larson, III et al. |
| 7,339,445 B2 | 3/2008 | Aigner et al. |
| 7,365,612 B2 | 4/2008 | Rohde et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,388,318 B2 | 6/2008 | Yamada et al. |
| 7,388,454 B2 | 6/2008 | Ruby et al. |
| 7,388,455 B2 | 6/2008 | Larson, III et al. |
| 7,403,082 B2 | 7/2008 | Kearns |
| 7,408,428 B2 | 8/2008 | Larson, III |
| 7,414,349 B2 | 8/2008 | Sasaki |
| 7,414,495 B2 | 8/2008 | Iwasaki et al. |
| 7,423,503 B2 | 9/2008 | Larson, III et al. |
| 7,425,787 B2 | 9/2008 | Larson, III |
| 7,439,824 B2 | 10/2008 | Aigner |
| 7,498,899 B2 | 3/2009 | Iwaki et al. |
| 7,501,903 B2 | 3/2009 | Gabara |
| 7,501,912 B2 | 3/2009 | Jamneala |
| 7,545,532 B2 | 6/2009 | Muramoto |
| 7,629,865 B2 | 12/2009 | Ruby |
| 7,800,461 B2 * | 9/2010 | Terada et al. .................. 333/175 |
| 7,808,935 B2 | 10/2010 | Koga et al. |
| 7,821,357 B2 | 10/2010 | Heinze et al. |
| 7,889,024 B2 | 2/2011 | Bradley et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2004/0016995 A1 | 1/2004 | Kuo et al. |
| 2004/0017130 A1 | 1/2004 | Wang et al. |
| 2004/0056735 A1 | 3/2004 | Nomura et al. |
| 2004/0092234 A1 | 5/2004 | Pohjonen |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0227578 A1 | 11/2004 | Hamalainen |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0073375 A1 | 4/2005 | Sul et al. |
| 2005/0093396 A1 | 5/2005 | Larson, III et al. |
| 2005/0093653 A1 | 5/2005 | Larson, III et al. |
| 2005/0093654 A1 | 5/2005 | Larson, III et al. |
| 2005/0093655 A1 | 5/2005 | Larson, III et al. |

| | | | |
|---|---|---|---|
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206483 A1 | 9/2005 | Pashby et al. |
| 2005/0218488 A1 | 10/2005 | Matsuo |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0139121 A1 | 6/2006 | Jhung |
| 2006/0164183 A1 | 7/2006 | Tikka et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284707 A1 | 12/2006 | Larson, III et al. |
| 2006/0290446 A1 | 12/2006 | Aigner et al. |
| 2007/0037311 A1 | 2/2007 | Izumi et al. |
| 2007/0046395 A1 | 3/2007 | Tsutsumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2008/0055020 A1 | 3/2008 | Handtmann et al. |
| 2008/0079648 A1 | 4/2008 | Forstner et al. |
| 2008/0100397 A1 | 5/2008 | Nam et al. |
| 2008/0297279 A1 | 12/2008 | Thalhammer et al. |
| 2008/0297280 A1 | 12/2008 | Thalhammer et al. |
| 2009/0149136 A1 | 6/2009 | Rofougaran |
| 2010/0150075 A1 | 6/2010 | Inoue et al. |
| 2010/0194488 A1 | 8/2010 | Yoshimoto |
| 2010/0244979 A1 | 9/2010 | Matsuda et al. |
| 2010/0272310 A1 | 10/2010 | Philliber et al. |
| 2010/0308930 A1 | 12/2010 | Ayazi et al. |
| 2010/0327697 A1 | 12/2010 | Choy et al. |
| 2010/0327994 A1 | 12/2010 | Choy et al. |
| 2011/0018653 A1 | 1/2011 | Bradley |
| 2011/0018654 A1 | 1/2011 | Bradley et al. |
| 2011/0109383 A1 | 5/2011 | Lan et al. |

FOREIGN PATENT DOCUMENTS

| | | |
|---|---|---|
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 61054686 | 3/1986 |
| JP | 06005944 | 1/1994 |
| JP | 2002/217676 | 8/2002 |
| JP | 2003/124779 | 4/2003 |
| WO | WO-98/16957 | 4/1998 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

U.S. Appl. No. 12/627,122, filed Nov. 30, 2009, Fitz, Martin.
"A partial copy of GB Search Report for", Application No. GB0522393.8 Jan. 9, 2006 , 4 pages.
"A partial copy of GB Search Report for Application No.", GB0525884.3 Feb. 2, 2006 , 4 pgs.
"British Search Report Application No.", 0605222.9 Jul. 11, 2006.
"Examination report corresponding to application No.", GB0605770.7 Aug. 25, 2006.
"Examination Report from UK for application", GB 0605971.1 Aug. 24, 2006.
"Search Report for Great Britain Patent Application", No. 0617742.2 Mar. 29, 2007.
"Search Report from corresponding application", No. GB0605225.2 Jun. 26, 2006.
"Search report from corresponding application No.", GB0620152.9 Nov. 15, 2006.
"Search report from corresponding application No.", GB0620653.6 Nov. 17, 2006.
"Search Report from corresponding application No.", GB0620655.1 Nov. 17, 2006.
"Search Report from corresponding application No.", GB0620657.7 Nov. 23, 2006.
"Search Report from corresponding application No.", GB 0605779.8 Aug. 23, 2006.
"Search Report in the Great Britian Patent Application", No. 0619698.4 Nov. 30, 2006.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of The Electrochemical Society*, vol. 146, No. 5 1999, 1879-1883.
Auld, B. A. , "Acoustic Resonators", Acoustic Fields and Waves in Solids, Second Edition, vol. II 1990 , 250-259.
Bauer, L. O. et al., "Properties of Silicon Implanted with Boron Ions through Thermal Silicon Dioxide", *Solid State Electronics*, vol. 16, No. 3 Mar. 1973 , 289-300.
Choi, Sungjin et al., "Design of Half-Bridge Piezo-Transformer Converters in the AC Adapter Applications", APEC 2005, IEEE Mar. 2005 , 244-248.
Coombs, Clyde F. , "Electronic instrument Handbook", *Second Edition, McGraw-Hill, Inc.* 1995 , pp. 5.1 to 5.29.
Fattinger, G. G. et al., "Coupled Bulk Acoustic Wave Resonator Filters: Key technology for single-to-balanced RF filters", 0-7803-8331-1/4/W20.00; IEEE MTT-S Digest 2004 , 927-929.
Hadimioglu, B. et al., ""Polymer Films As Acoustic Matching Layers".", *1990 IEEE Ultrasonics Symposium Proceedings*, vol. 3 PP. Previously submitted as "Polymer Files As Acoustic Matching Layers, 1990 IEEE Ultrasonics Symposium Proceeding. vol. 4 PP. 1227-1340, Dec. 1990". Considered by Examiner on Mar. 20, 2007 Dec. 1990, 1337-1340.

Hara, K., "Surface Treatment of Quartz Oscillator Plate by Ion Implantation", Oyo Buturi, vol. 47, No. 2 Feb. 1978, 145-146.

Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

Jiang, Yimin et al., "A Novel Single-Phase Power Factor Correction Scheme", *IEEE* 1993, 287-292.

Jung, Jun-Phil et al., "Experimental And Theoretical Investigation On The Relationship Between AIN Properties And AIN-Based FBAR Characteristics", *2003 IEEE International Frequency Control Symposium and PDA Exhibition Jointly with the 17th European Frequency and Time Forum* Sep. 3, 2003, 779-784.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* May 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications" *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M. "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics. Symposium*, Caesar's Tahoe, NV Oct. 1999, 895-906.

Lakin, et al., "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AIN FBAR Resonators", IEEE Ultrasonics Symposium 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators And Filters", *2001 IEEE Ultrasonics Symposium* Jan. 1, 2001, 807-811.

Martin, Steven J. et al., "Development Of A Low Dielectric Constant Polymer For The Fabrication Of Integrated Circuit Interconnect", *12 Advanced Materials* Dec. 23, 2000, 1769-1778.

Navas, J. et al., "Miniaturised Battery Charger using Piezoelectric Transformers", *IEEE* 2001, 492-496.

Ng, J. et al., "The Diffusion Ion-implanted Boron in Silicon Dioxide", AIP Conf Proceedings, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pang, W. et al., "High Q Single-Mode High-Tone Bulk Acoustic Resonator Integrated With Surface-Machined FBAR Filter", Microwave Symposium Digest, IEEE MTT-S International 2005, 413-416.

Parker, T. E. et al., "Temperature-Compensated Surface Acoustic-Wave Devices with SiO2 Film Overlays", J. Appl. Physics, vol. 50 1360-1369, Mar. 1979.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C., "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schuessler, Hans H., "Ceramic Filters and Resonators", Reprinted from *IEEE Trans. Sonics Ultrason.*, vol. SU-21 Oct. 1974, 257-268.

Spangenberg, B. et al., "Dependence of the Layer Resistance of Boron Implantation in Silicon and the Annealing Conditions", *Comptus Rendus des l'Academic Bulgare des Sciences*, vol. 33, No. 3 1980, 325-327.

Tiersten, H, F. at al., "An Analysis of Thickness-Extensional Trapped Energy Resonant Device Structures with Rectangular Electrodes in the Piezoelectric Thin Film on Silicon Configuration", *J. Appy. Phys.* 54 (10) Oct. 1983, 5893-5910.

Topich, J. A. et al., "Effects of Ion Implanted Fluorine in Silicon Dioxide", *Nuclear Instr. And Methods Cecon Rec.* Cleveland, OH May 1978, 70-73.

Tsubbouchi, K. et al., "Zero Temperature coefficient Surface Acoustic Wave Devices using Epitaxial AIN Films", *IEEE Ultrasonic symposium*, San Diego, CA, 1082 1982, 240-245.

Vasic, D et al., "A New Method to Design Piezoelectric Transformer Used in MOSFET & IGBT Drive Circuits", *IEEE 34th Annual Power Electronics Specialists Conference* 2003 vol. 1 Jun. 15-19, 2003, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

Yang, C.M. at al., "Highly C Axis Oriented AIN Film Using MOCVD for 5GHx Band FBAR Filter", *2003 IEEE Ultrasonics Symposium* Oct. 5, 2003, pp. 170-173.

\* cited by examiner

DUPLEXER WITH NEGATIVE PHASE SHIFTING CIRCUIT

BACKGROUND

Portable communication devices, such as cellular telephones, personal digital assistants (PDAs), electronic gaming devices, laptop computers and the like, are configured to communicate over wireless networks. Accordingly, each such portable communication device relies on a transmitter (TX) and a receiver (RX), typically connected to a common antenna, for sending and receiving data and control signals over the wireless network. In order to use the common antenna, a multiplexer may be included to electrically connect the common signal path to the input of the receiver and to the output of the transmitter, so that the transmitter is able to send signals on a transmit frequency and the receiver is able to receive signals on a different receive frequency with negligible mutual interference between the transmit and receive signals. The multiplexer may be identified by different names depending on the number of signal paths to which the multiplexer is connected. For example, a duplexer connects two different signal paths, a triplexer connects three different signal paths, and a quintplexer connects five different signal paths. When the multiplexer connects the common antenna to the transmitter and receiver, the multiplexer is commonly called a transmit/receive antenna duplexer.

An antenna duplexer provides the necessary coupling, while preventing the transmit signal generated by the transmitter from being coupled from the common antenna back to the input of the receiver and overloading the receiver. Generally, the duplexer includes two band-pass filters having different passbands for filtering the transmit and receive signals, respectively, thus preventing or reducing interference between the transmit and receive signals. The filters are connected in parallel at the common antenna, and need to have sufficient rejection for the opposite band.

The antenna duplexer has three ports. The first port is connected to the antenna, the second port is connected to the transmitter and third port is connected to the receiver. Transmit and receive signals are assigned to different frequency bands, referred to as the Tx frequency band and the Rx frequency band, respectively. However, the transmit and receive signals co-exist at the common antenna, as discussed above. Thus, for the transmission path, the duplexer suppresses all signals outside the Tx frequency band to prevent interference with signals within the Tx frequency band sent to the antenna. Likewise, for the reception path, the duplexer suppresses all signals outside the Rx frequency band to prevent interference with signals within the Rx frequency band sent to the receiver from the antenna. Hence, the duplexer includes two frequency selective RF-filters, one filter for the Rx frequency band and the other filter for the Tx frequency band. Both RF filters are electrically connected to the common antenna port. In order to prevent the impedance of one of the RF filters to degrade the antenna side impedance of the other RF filter, an additional matching circuit is included.

The transmitters and receivers may be implemented in various types of wireless network, according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting (uplink or TX frequency band) and receiving (downlink or RX frequency band) signals. For example, UMTS Band 2 (PCS) provides an uplink frequency band of 1850 MHz-1910 MHz and a downlink frequency band of 1930 MHz-1990 MHz; UMTS Band 3 (DCS) provides an uplink frequency band of 1710 MHz-1785 MHz and a downlink frequency band of 1805 MHz-1880 MHz; UMTS Band 7 (IMT-E) provides an uplink frequency band of 2500 MHz-2570 MHz and a downlink frequency band of 2620 MHz-2690 MHz; and UMTS Band 8 (GMS-900) provides an uplink frequency band of 880 MHz-915 MHz and a downlink frequency band of 925 MHz-960 MHz. Accordingly, an antenna duplexer operating in compliance with a UMTS standard would include a transmit filter having a passband within the corresponding uplink frequency band, and a receive filter having a passband within the corresponding downlink frequency band.

Demand for smaller, less expensive and more efficient portable communication devices is significant. Therefore, reducing size and weight of portable communication devices, as well as reducing fabrication costs and increasing product yield, are priorities. For example, there is demand for the band-pass filters of duplexers in portable communication devices to be smaller, to consume less power, to have improved performance characteristics (such as lower insertion loss and higher out-of-band attenuation), and to operate at higher frequencies. Such duplexers may include resonators for filtering the transmit and receive signals, such as a thin film bulk acoustic resonators (FBARs). However, design and fabrication are difficult, e.g., due to passband and stopband requirements of the corresponding receive and transmit band-pass filters, and matching circuit requirements between the band-pass filters and the antenna.

SUMMARY

In a representative embodiment, a duplexer interfacing a receiver and a transmitter with a common antenna includes first and second acoustic filters and a phase shifter. The first acoustic filter is connected between the antenna and the transmitter, and has a first passband. The second acoustic filter is connected between the antenna and the receiver, and has a second passband. The phase shifter includes at least one series capacitor connected in series with the antenna and at least one shunt inductor connected between the at least one capacitor and ground. The phase shifter is connected between the antenna and the first acoustic filter when the first passband is higher than the second passband, and provides a negative phase shift of an output impedance of the first acoustic filter. The phase shifter is connected between the antenna and the second acoustic filter when the second passband is higher than the first passband, and provides a negative phase shift of an input impedance of the second acoustic filter.

In another representative embodiment, a duplexer includes transmit and receive filters and a phase shifter. The transmit filter is connected in series between an antenna terminal and a transmitter terminal. The receive filter is connected in series between the antenna terminal and a receiver terminal, the receive filter having a higher passband center frequency than the transmit filter. The phase shifter is connected in series between the antenna terminal and an input of the receive filter. The phase shifter includes a capacitor connected in series between the antenna terminal and the input of the receive filter, a first inductor connected between a first end of the capacitor and ground voltage, and a second inductor connected between a second end of the capacitor and the ground voltage. The phase shifter provides a negative phase shift of an input impedance of the receive filter.

In another representative embodiment, a duplexer includes transmit and receive filters and a phase shifter. The transmit filter is connected in series between an antenna terminal and a transmitter terminal. The receive filter is connected in series between the antenna terminal and a receiver terminal, the receive filter having a higher passband center frequency than the transmit filter. The phase shifter is connected in series between the antenna terminal and an input of the receive filter. The phase shifter includes first and second capacitors connected in series between the antenna terminal and the input of the receive filter, and one shunt inductor having a first end connected between the first and second series capacitors and a second end connected to a ground voltage. The phase shifter provides a negative phase shift of an input impedance of the receive filter.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
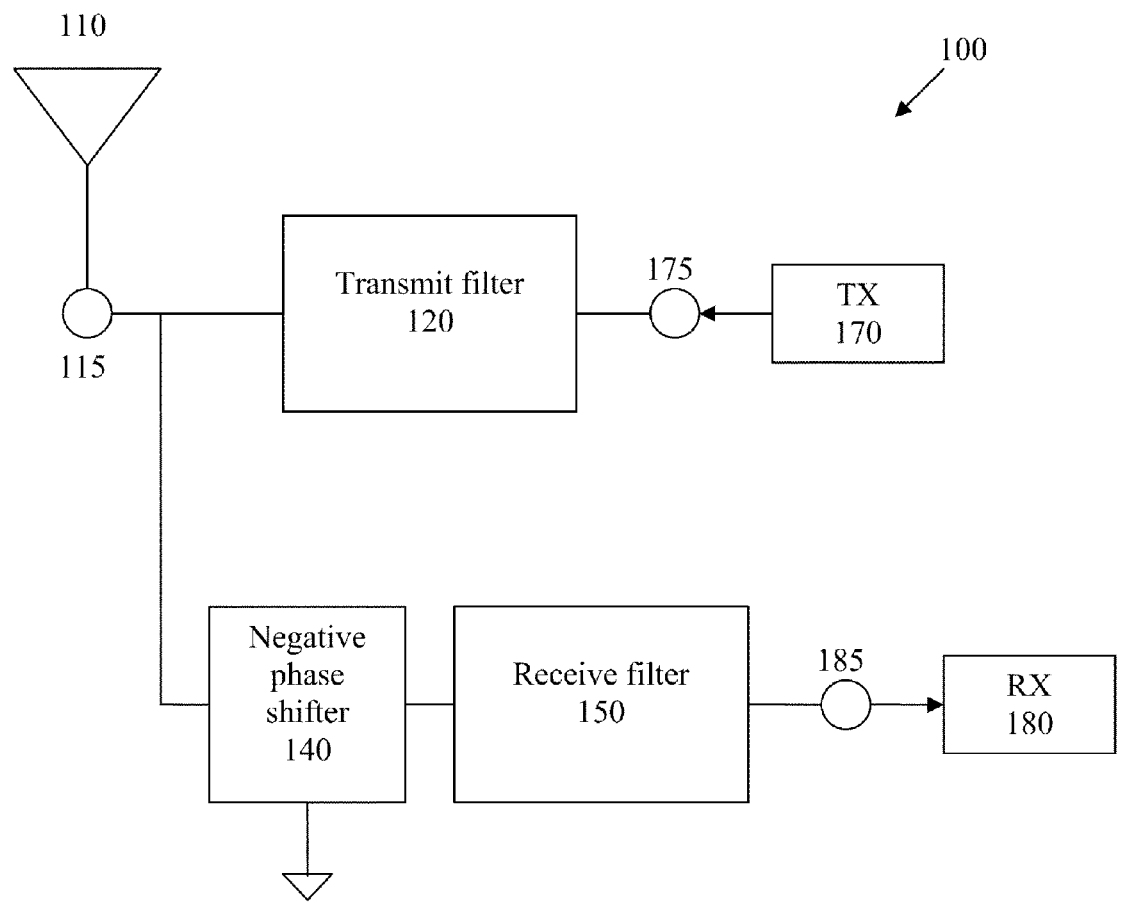
FIG. 1 is a block diagram illustrating a duplexer with a phase shifter, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

FIG. 1 is a block diagram illustrating a duplexer having resonator band-pass filters, according to a representative embodiment.

Referring to FIG. 1, duplexer 100 interfaces transmitter (TX) 170 and receiver (RX) 180 and with a common antenna 110, for receiving and sending wireless communications signals. The wireless communications signals may be radio frequency (RF) signals, for example, complying with various communication standards, examples of which are discussed above.

In the depicted representative embodiment, the duplexer 100 includes transmit filter 120 connected between TX 170 through transmitter terminal 175 and antenna 110 through antenna terminal 115, and receive filter 150 connected between RX 180 through receiver terminal 185 and the antenna 110 through the antenna terminal 115. In addition, a negative phase shifter 140 is connected in series between the antenna terminal 115 and the receive filter 150. In the depicted embodiment, it is assumed for purpose of discussion that the receive filter 150 has a higher passband than the transmit filter 120, and therefore the negative phase shifter 140 is shown connected between antenna terminal 115 and the receive filter 150. However, it is understood that in various alternative embodiments and/or configurations, the negative phase shifter 140 may be connected elsewhere, without departing from the scope of the present teachings. For example, if the transmit filter 120 were to have a higher passband than the receive filter 150, the negative phase shifter 140 would be connected between antenna terminal 115 and the transmit filter 120.

The negative phase shifter 140 is used for impedance transformation. As used herein, the input impedance of a receive filter is the impedance of the receive filter at the antenna side, and the output impedance of a transmit filter is the impedance of the transmit filter at the antenna side. Accordingly, in the depicted embodiment, the phase shifter 140 transforms the input impedance of the receive filter 150, which is the impedance of the receive filter 150 at the antenna 110 side. As discussed above, the duplexer 100 may be configured such that the phase shifter 140 transforms the output impedance of the transmit filter 120, which is the impedance of the transmit filter 120 at the antenna 110 side.

Figure 6A:
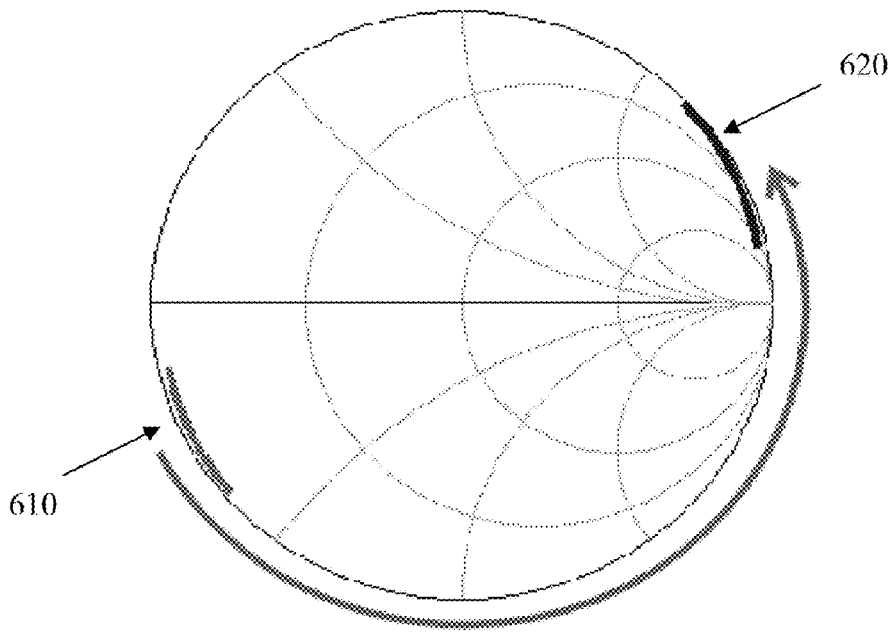
FIGS. 6A and B are polar plots illustrating operation of a phase shifter of a duplexer, according to a representative embodiment.
Figure 6B:
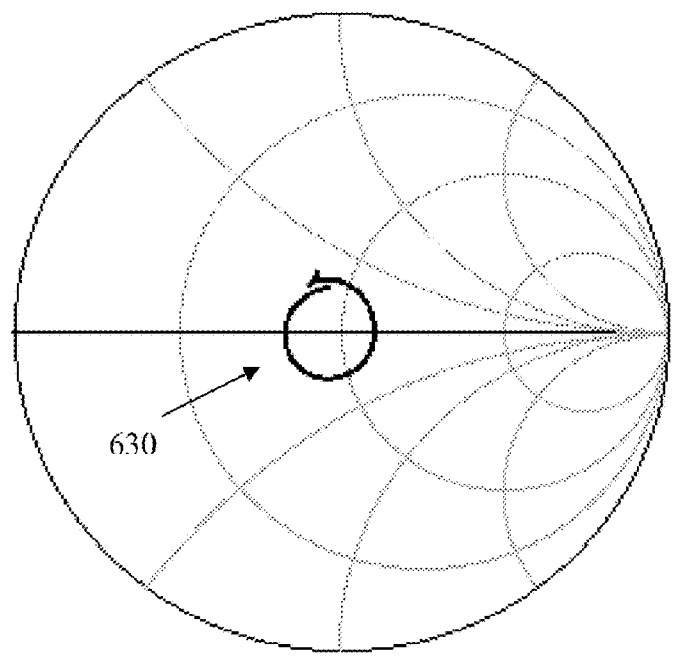

Generally, a phase shifter is a function element that provides an impedance transformation, which may be illustrated, for example, by rotation in relation to a reference impedance, e.g., as shown in a Smith Diagram. The rotation is positive for positive phase shifters and the rotation is negative for negative phase shifters, such as negative phase shifter 140. The rotation angle in a Smith Diagram, such as the Smith Diagrams shown in FIGS. 6A and 6B, is twice the phase shift angle.

In an embodiment, the negative phase shifter 140 shifts impedance on an antenna side of the receive filter 150 by about −90° for matching purposes, for example, instead of about +90° as provided by conventional phase shifters. The transmit filter 120 band-pass filters uplink signals sent from TX 170 through the antenna 110, and the receive filter 150 band-pass filters downlink signals passing through the antenna 110 to RX 180. The duplexer 100 may be incorporated into any type of portable communication device, such as a cellular telephone, PDA, electronic gaming device, laptop computer and the like.

Figure 2:
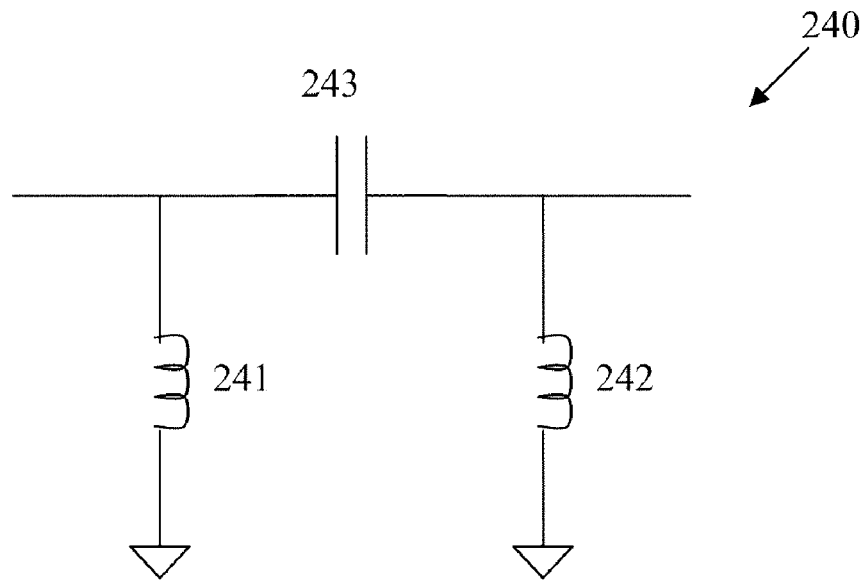
FIG. 2 is a circuit diagram illustrating a phase shifter of a duplexer, according to a representative embodiment.
Figure 3:
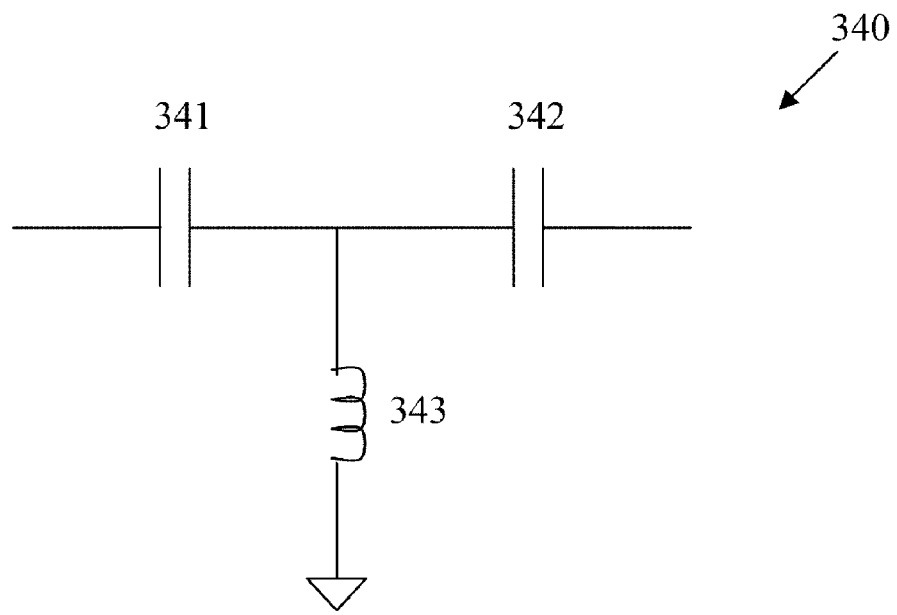
FIG. 3 is a circuit diagram illustrating a phase shifter of a duplexer, according to a representative embodiment.

The phase shifter 140 of the duplexer 100 is connected in series between the antenna port 115 and the receive filter 150. Example configurations of the phase shifter 140 designed for an operating frequency are shown in FIGS. 2 and 3, below. The negative phase shifting behavior of the phase shifter 140 is functionally an approximation of a transmission line with a negative line-length, which otherwise is physically not feasible. For example, the transformation path between the antenna port 115 and the receive filter 150 is shortened for capacitive filter-impedances to have sufficiently high impedance values (i.e., ideally an "open"). Because of the shortened transformation path, the bandwidth of the matching by the negative phase shifter 140 expands. In other words, for capacitive circuits, a negative phase shift results in a shorter transformation path, which is correlated to the bandwidth of the transformation, thus improving broadband behavior of the transformation. In addition, the negative phase shifter 140 is effectively a high pass circuit. Therefore, low frequency rejection improves, for example, at DC and at half the receive frequency (Rx/2), as discussed below with reference to FIG. 9.

In comparison, a conventional duplexer typically includes a shunt or series resonator on the antenna side of the receive filter, and a phase shifter with a positive phase shift of approximately +90° (e.g., a λ/4 transmission line transformation circuit or a Pi-circuit formed by a series inductance and two shunt capacitances) between the antenna port and the receive filter. Due to the positive phase shift, low impedance at the antenna side of the receive filter in the transmitter frequency band is transformed to relatively high impedances, effectively transforming a short circuit to an open circuit at the transmit frequency. Also, the +90° phase shift has an unwanted/unprofitable low pass characteristic and does not provide a direct DC current path from the antenna to ground. There is no electrostatic discharge (ESD) robustness, and thus additional circuitry is required to ensure ESD protection and robustness.

In addition, some conventional impedance matching/transforming circuits have limited degrees of freedom. For example, U.S. Pat. No. 7,339,445, issued Mar. 4, 2008, which is hereby incorporated by reference, discloses a phase shifter consisting of one shunt inductor. Accordingly, the conventional phase shifter has one degree of freedom, namely the value of the one shunt inductor. The conventional phase shifter works only for specially designed filter dies, since the input impedance of the receive filter and the output impedance of the transmit filter are integral to the matching circuitry.

Further, implementation of the conventional λ/4-transmission line transformation circuit, for example, requires a multilayer substrate and a relatively large area. Due to its physical size, the λ/4-transmission line transformation circuit has increased losses at lower frequencies, making a compact and low-loss realization more difficult at low frequencies. Also, since low frequencies will pass conventional phase shifters, there is no improved low frequency rejection at DC and Rx/2, discussed below with reference to FIG. 9.

FIG. 2 is a circuit diagram illustrating a modified Pi-circuit with a negative phase shift, according to a representative embodiment. Referring to FIG. 2, phase shifter 240 includes a series capacitance, indicated by capacitor 243, and two shunt inductances, indicated by inductors 241 and 242. The inductors 241 and 242 are connected between ground and each side of the capacitor 243, respectively. When incorporated into the duplexer 100 shown in FIG. 1, an input of the phase shifter 240 is connected to the antenna terminal 115 and an output is connected to the input of the receive filter 150. In the depicted embodiment, the phase shifter 240 provides a DC-current-path from the antenna port (e.g., antenna port 115) to ground, which improves the ESD robustness.

As stated above, the phase shifter 240 approximates a transmission line with negative length. The values of the capacitor 243 (C) and the inductors 241 and 242 ($L_1$, $L_2$) are represented by equations (1) and (2), below. Z0 is characteristic impedance, γ is a complex transfer constant (γ=α+jβ, where α is an attenuation factor and jβ is a phase constant), l is line length and f is frequency.

$$C = \frac{-1}{Z0 \cdot 2 \cdot \pi \cdot f \cdot \sin(\beta \cdot l)} \quad (1)$$

$$L_1 = L_2 = \frac{-Z0 \cdot (1 + \cos(\beta \cdot l))}{2 \cdot \pi \cdot f \cdot \sin(\beta \cdot l)} \quad (2)$$

In Equations (1) and (2), when l is a negative value (e.g., due to the negative transmission line approximation), the calculated values for C, $L_1$ and $L_2$ are positive. The definition of electrical length E is β·l. Pi-circuit reoptimization in the duplexer application will typically change the calculated element values slightly. Also, in various embodiments, $L_1$ and $L_2$ may be the same or slightly different from one another. All of the elements are assumed to be ideal, although it is understood that they may be lossy in practice.

FIG. 3 is a circuit diagram illustrating a modified T-circuit with a negative phase shift, according to an alternative representative embodiment. Referring to FIG. 3, phase shifter 340 includes two series capacitances, indicated by capacitors 341 and 342, and one shunt inductance, indicated by inductor 343. The shunt inductor 343 is connected between ground and a connection between the series capacitors 341 and 342. When incorporated into the duplexer 100 shown in FIG. 1, an input of the phase shifter 340 is connected to the antenna terminal 115 and an output is connected to the input of the receive filter 150.

As stated above, the phase shifter 340 approximates a transmission line with negative length. The values of the capacitors 341 and 342 ($C_1$, $C_2$) and the inductors 343 (L) are represented by equations (3) and (4), below:

$$C_1 = C_2 = \frac{-(1 + \cos(\beta \cdot l))}{2 \cdot \pi \cdot f \cdot Z0 \cdot \sin(\beta \cdot l)} \quad (3)$$

$$L = \frac{-Z0}{2 \cdot \pi \cdot f \cdot \sin(\beta \cdot l)} \quad (4)$$

In Equations (3) and (4), when l is a negative value (e.g., due to the negative transmission line approximation), the calculated values for $C_1$, $C_2$ and L are positive, as discussed above. T-circuit reoptimization in the duplexer application will typically change the calculated element values slightly. Also, in various embodiments, $C_1$ and $C_2$ may be the same or slightly different from one another. All of the elements are assumed to be ideal, although it is understood that they may be lossy in practice.

In various embodiments, the phase shifters 240 and 340 are incorporated into receive circuits of duplexers, e.g., between the antenna terminal and the receive filter. For example, FIG. 4 is a circuit diagram illustrating a duplexer with a phase shifter and filters, according to a representative embodiment.

Figure 4:
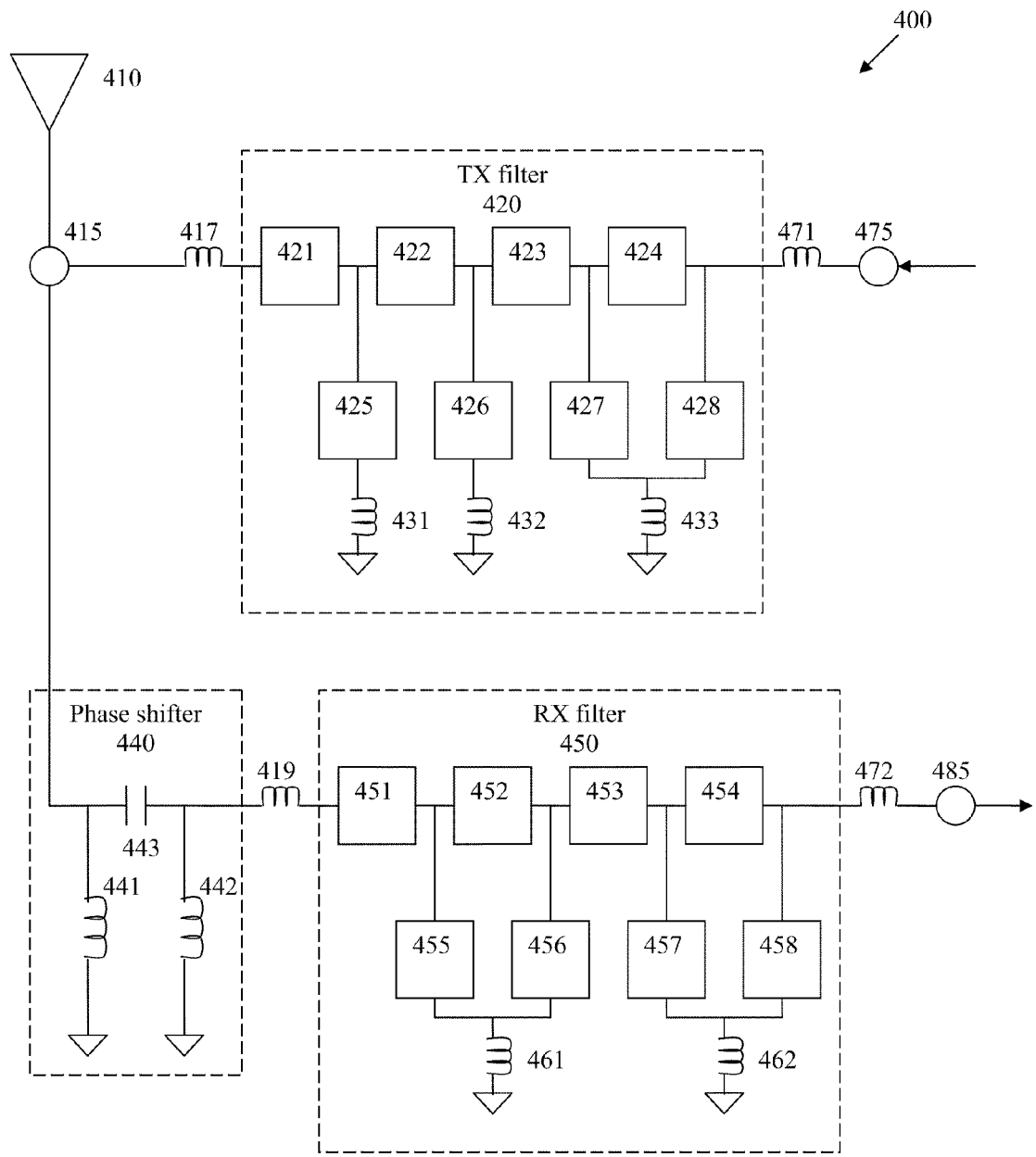
FIG. 4 is a circuit diagram illustrating a duplexer with a phase shifter and filters, according to a representative embodiment.

Referring to FIG. 4, duplexer 400 is shown as including a transmit filter 420, a receive filter 450 and a negative phase shifter 440. In the depicted embodiment, the transmit and receive filters 420 and 450 are ladder type filters. Also, the phase shifter 440 is a Pi-circuit, including series capacitor 443 connected between shunt inductors 441 and 442, as discussed above with reference to phase shifter 240 of FIG. 2. The negative phase shift (e.g., about −90°) of the phase shifter 440 is used for matching. Thus, in particular for capacitive filter impedances, the bandwidth of the matching is expanding. The matching circuit may be within and/or at the top of the module substrate or may include the die of the receive filter 450 itself.

The transmit and receive filters 420 and 450 are configured with resonators 421-428 and 451-458. According to various embodiments, each of the resonators 421-428 and 451-458 may be a bulk acoustic wave (BAW) resonator such as a film bulk acoustic resonator (FBAR) or a solidly mounted resonator (SMR), for example, and includes a thin film piezoelectric layer formed in a stacked structure between top and bottom electrodes. The thin film piezoelectric layer may be formed of a material such as aluminum nitride, lead zirconate titanate (PZT), or other film compatible with semiconductor processes. In an embodiment, the resonators 421-428 and 451-458 are fabricated using a common layer of piezoelectric material. The top and bottom electrodes may be formed of any conductive metal compatible with semiconductor processes, such as molybdenum, tungsten, aluminum or the like. Alternatively, each of the series and shunt resonators may be 421-428 and 451-458 a surface acoustic wave (SAW) resonator.

Referring to FIG. 4, the transmit filter 420 is a ladder type filter, having multiple series and shunt resonators 421-428. More particularly, the transmit filter 420 has a series circuit including first through fourth transmit filter series resonators 421-424 connected in series between two bond wires or line inductances, indicated by inductor 417 and inductor 471, from the antenna terminal and the transmitter terminal 475. The transmit filter 420 also has shunt circuits which respectively include first through fourth shunt resonators 425-428 and first through third inductors 431-433 generally connected between the series circuit and ground. In the depicted embodiment, the first and second shunt resonators 425 and 426 are connected to ground through the first and second inductors 431 and 432, respectively, and the third and fourth shunt resonators 427 and 428 are commonly connected to ground through the third inductor 433.

In the depicted representative embodiment, it is assumed that the impedance at the antenna side of the transmit filter 420 at the RF frequency of the received signals is high enough, so there is no additional impedance matching circuit (e.g., phase shifter) needed between the transmit filter 420 and the antenna node 415. This is typically the case when the transmit filter 420 and the receive filter 450 are acoustic filters, and the transmit filter 420 has a lower passband frequency than the receive filter 450. However, it is understood that in various embodiments and/or configurations, the transmit filter 420 may need an impedance matching circuit, such as phase shifter 240, 340 of FIGS. 2 and 3, in order to provide unique benefits for any particular situation or to meet application specific design requirements of various implementations, as would be apparent to one skilled in the art. Examples in which a transmit filter may have an impedance matching circuit, either instead of or in addition to an impedance matching circuit of a corresponding receive filter, include base station duplexers in which the Rx and Tx frequencies are permuted and duplexers operating in 3GPP Bands 13 and 14 in which the Tx frequency is higher than the Rx frequency. In both cases, the receive filter would have sufficiently high impedance and the transmit filter would need a series phase shifter.

In an embodiment, the series and shunt resonators 421-428 of the transmit filter 420 have the same coupling coefficient, which may or may not also be the same coupling coefficient as the series and shunt resonators 451-458 of the receive filter 450. Use of minimum coupling coefficients with respect to series and shunt resonators 421-428 and/or 451-458 enables reduction in die size.

More particularly, in the depicted representative embodiment, first shunt resonator 425 has one end (e.g., top electrode) connected between first and second series resonators 421 and 422, and an opposite end (e.g., bottom electrode) connected to ground through inductor 431. Second shunt resonator 426 has one end connected between second and third series resonators 422 and 423 an opposite end connected to ground through inductor 432. Third shunt resonator 427 has one end connected between third and forth series resonators 423 and 424 and an opposite end connected to ground through inductor 433. Fourth shunt resonator 428, which is connected closest to the transmitter terminal 475, has one end connected between fourth series resonator 424 and bond wire or line inductance, indicated by inductor 471, between the input of transmit filter 420 and the transmitter terminal 475, and an opposite end connected to ground through inductor 433.

The receive filter 450 is also a ladder type filter, having multiple series and shunt resonators 451-458. More particularly, the receive filter 450 has a series circuit including first through fourth receive filter series resonators 451-454 connected in series between two bond wires or line inductances, indicated by inductor 419 and inductor 482, from the phase shifter 440 and the receiver terminal 485. The receive filter 450 also has shunt circuits which respectively include first through fourth shunt resonators 455-458 and first and second inductors 461-462 generally connected between the series circuit and ground. In the depicted embodiment, the first and second shunt resonators 455 and 456 are commonly connected to ground through the first inductor 461, and the third and fourth shunt resonators 457 and 458 are commonly connected to ground through the second inductor 462. In an embodiment, the series and shunt resonators 451-458 of the receive filter 450 have the same coupling coefficient, which may or may not also be the same coupling coefficient as the series and shunt resonators 421-428 of the transmit filter 420, as stated above.

More particularly, in the depicted representative embodiment, first shunt resonator 455 has one end (e.g., top electrode) connected between first and second series resonators 451 and 452, and an opposite end (e.g., bottom electrode) connected to ground through inductor 461. Second shunt resonator 456 has one end connected between second and third series resonators 452 and 453, and an opposite end connected to ground through inductor 461. Third shunt resonator 457 has one end connected between third and forth series resonators 453 and 454, and an opposite end connected to ground through inductor 462. Fourth shunt resonator 458, which is connected closest to the receiver terminal 485, has one end connected between fourth series resonator 454 and bond wire or line inductance, indicated by inductor 482, between the output of the receive filter 450 and the receive terminal 485, and an opposite end connected to ground through inductor 462.

In an embodiment, the common ground inductors 461 and 462 of the receive filter 450 and/or the inductors 441 and 442 of the phase shifter 440 may be fabricated on a common substrate with the receive series and shunt resonators 451-458 and/or on a silicon or polymer capping, but these inductors could also be implemented as traces on an organic or ceramic substrate with or without wirebonds. Likewise, in an embodiment, the ground inductors 431-433 of the transmit filter 420 may be fabricated on a common substrate with the receive series and shunt resonators 421-428 and/or on a silicon or polymer capping, but these inductors could also be implemented as traces on an organic or ceramic substrate with or without wirebonds. Also, in an embodiment, the transmit and receive filters 420 and 450, as well as the phase shifter 440, are integrally mounted in the same package.

The center frequencies of the passbands for the receive filter 450 and the transmit filter 420 are offset from one another, reducing or avoiding overlap of the respective passbands. The center frequencies are selected to be within the downlink and uplink frequency bands of the applicable communication standard, respectively. For example, in accordance with the GSM-900 standard, the available frequency band for the receive filter 450 is 925 MHz-960 MHz and the available frequency band for transmit filter 420 is 880 MHz-915 MHz. Thus, for purposes of illustration only, it may be assumed that the passband center frequency of the receive filter 450 is about 943.3 MHz and the passband center frequency of the transmit filter 420 is about 887.2 MHz. However, it is understood that the various embodiments may incorporate different standards, or may include different center frequencies and/or passbands in accordance with the GSM-900 standard, without departing from the scope of the present teachings.

The phase shifter 440 and/or the transmit and receive filters 420 and 450 may be implemented completely or partially in a multilayer module substrate or laminate, such as a printed circuit board (PCB), completely or partially by external components, such as surface mounted devices (SMDs) at a module substrate, or any combination thereof. Furthermore, the receive filter 450 and/or the transmit filter 420 can be used to implement some or all components of the phase shifter 440, in which case one or all of the shunt inductors 441, 442 and the capacitor 443 may be implemented within the die of the receive filter 450 and/or the die of the transmit filter 420, without departing from the scope of the present teachings. For example, one shunt inductor 441, 442 may be on a common substrate with the receive series and shunt resonators 451-458 and/or on a silicon or polymer capping of the receive filter 450, while the other shunt inductor 441, 442 may be on a common substrate with the transmit series and shunt resonators 421-428 and/or on a silicon or polymer capping of the transmit filter 420. Also, the shunt inductances 441-442 may be implemented in the module substrate, connected by a bondwire, for example.

In various embodiments, the phase shifter 340 depicted in FIG. 3 may be included in the duplexer 400 in place of the phase shifter 440 to obtain substantially the same results. Also, in various embodiments, the functionality of the phase shifter 440 (or phase shifter 340) may be implemented using one −90° phase shifter, as shown in FIG. 4, or using multiple cascaded phase shifters. For example, a −90° phase shift may be implemented by two cascaded −45° phase shifters, three cascaded −30° phase shifters, and the like. Cascaded phase shifters may have the same or different configurations. For example, a negative phase shifting circuit having two cascaded phase shifters may include one phase shifter 240, 440 as shown in FIGS. 2, 4 and another phase shifter 340 as shown in FIG. 3.

Further, implementation and operation of the phase shifter 440 (or phase shifter 340) is not restricted to any particular filter configuration, such as the depicted representative configuration of the receive filter 450, nor restricted to special optimized filters, because of a higher degree of freedom. For example, the receive filter 450 is not limited starting at the antenna side with a special kind of resonator, as indicated by the placement of the first series resonator 451. Thus, it is understood that in alternative embodiments, the duplexer 400 may include other types and configurations of transmit and receive filters 420 and 450, as well as the series and shunt resonators 421-428 and 451-458, without departing from the scope of the present teachings. It is further understood that alternative embodiments of the duplexer 400 may combine any representative embodiment of transmit filter with any representative embodiment of the receive filter.

Figure 5:
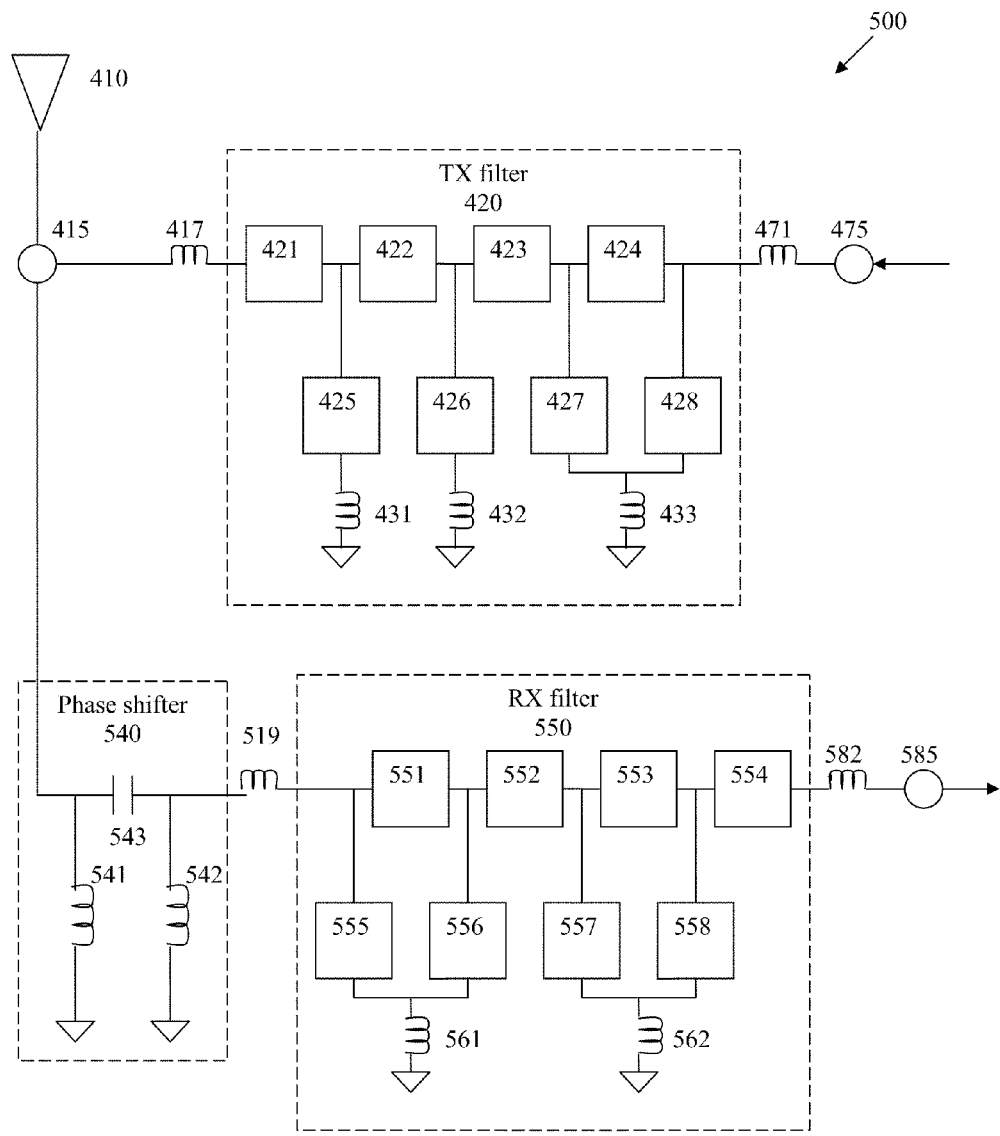
FIG. 5 is a circuit diagram illustrating a duplexer with a phase shifter and filters, according to a representative embodiment.

For example, FIG. 5 is a circuit diagram illustrating a duplexer with a phase shifter and filters, according to another representative embodiment.

Referring to FIG. 5, duplexer 500 is shown as including a transmit filter 420 and a negative phase shifter 540, which have substantially the same configurations as transmit filter 420 and phase shifter 440 discussed above with reference to FIG. 4, and therefore the respective descriptions are not repeated. However, FIG. 5 shows the compatibility of the phase shifter 540 with receive filter 550, which has a different topology than the receive filter 450 of FIG. 4, where the receive filter 550 starts at the antenna side with a shunt resonator as opposed to a series resonator.

In particular, the receive filter 550 has multiple series and shunt resonators 551-558, where the series resonators 551-554 are connected in series between two bond wires or line inductances, indicated by inductor 519 and inductor 582, from the phase shifter 540 and the receiver terminal 585. The receive filter 550 also has shunt circuits which respectively include first through fourth shunt resonators 555-558 and first and second inductors 561-562 generally connected between the series circuit and ground. In the depicted embodiment, the first and second shunt resonators 555 and 556 are commonly connected to ground through the first inductor 561, and the third and fourth shunt resonators 557 and 558 are commonly connected to ground through the second inductor 562. In an embodiment, the series and shunt resonators 551-558 of the receive filter 550 have the same coupling coefficient, which may or may not also be the same coupling coefficient as the series and shunt resonators 421-428 of the transmit filter 420, as stated above.

More particularly, in the depicted representative embodiment, first shunt resonator 555 has one end (e.g., top electrode) connected between the line inductor 519 and the first series resonator 551, and an opposite end (e.g., bottom electrode) connected to ground through inductor 561. Second shunt resonator 556 has one end connected between first and second series resonators 551 and 552, and an opposite end connected to ground through inductor 561. Third shunt resonator 557 has one end connected between second and third series resonators 552 and 553 and an opposite end connected to ground through inductor 562. Fourth shunt resonator 558, which is connected closest to the receiver terminal 585, has one end connected between third and fourth series resonators 553 and 554, and an opposite end connected to ground through inductor 562. The fourth series resonator 554 is connected to the receiver terminal 585 through a bond wire or line inductance, indicated by inductor 582.

FIGS. 4 and 5 depict two examples of receive filter configurations for purposes of illustration. It is understood that, in various embodiments, the configuration of the receive filter (and/or transmit filter) may vary to provide unique benefits for any particular situation or to meet application specific design requirements of various implementations, as would be apparent to one skilled in the art. It is further understood that the phase shifter 340 depicted in FIG. 3 may be included in the duplexers 400 and 500, in place of the phase shifter 440, 540, to obtain substantially the same results, without departing from the scope of the present teachings.

FIG. 6A is a Smith Diagram depicting characteristics of the receive path of a duplexer, according to a representative embodiment, where the transmitter and receiver are operating in UMTS Band 2, for example, with a transmit center frequency of about 1870 MHz and a receive center frequency of about 1950 MHz, respectively.

More particularly, FIG. 6A illustrates input impedance as polar plots of the complex reflection coefficient, which represents a ratio of complex amplitudes of the backward and forward waves at the input (antenna side) of the receive filter 550 in the Tx frequency band. Notably, the corresponding impedance at the antenna port 415 of the transmit filter 420 in the RX frequency band is already sufficiently high, so no additional matching circuit is needed for the transmit filter 420, as shown in FIG. 5.

Plot 610 of FIG. 6A shows input impedance of a receive filter (e.g., receive filter 550) without a phase shifter and without a transmit filter. The plot 610 indicates that the low impedance at the input of the receive filter 550 in the TX frequency band would shorten the transmit filter 420 at the common antenna port 415, necessitating a transformation circuit, such as phase shifter 540. Plot 620 shows shifted input impedance (e.g., by about −90°) with the phase shifter 540 in the receive path. As can be seen in FIG. 6A, the input impedance moves counter-clockwise to the opposite side of the polar plot, indicating approximately a −90° phase shift in the input impedance. The effect on input impedance is substantially the same in embodiments where phase shifter 340, shown in FIG. 3, is inserted in place of the phase shifter 540.

FIG. 6B is a Smith Diagram also depicting characteristics of the receive path of the duplexer, according to a representative embodiment, where the transmitter and receiver are operating in UMTS Band 2, for example.

More particularly, FIG. 6B illustrates overall input impedance of the antenna port 415 of duplexer 500, for example. The plot 630 of the polar plot shows the complex reflection coefficient and indicates that the input impedance is matched with a return loss better than −12 dB in the passbands of the transmit filter 420 and the receive filter 550, thus co-optimizing the filters.

Figure 7:
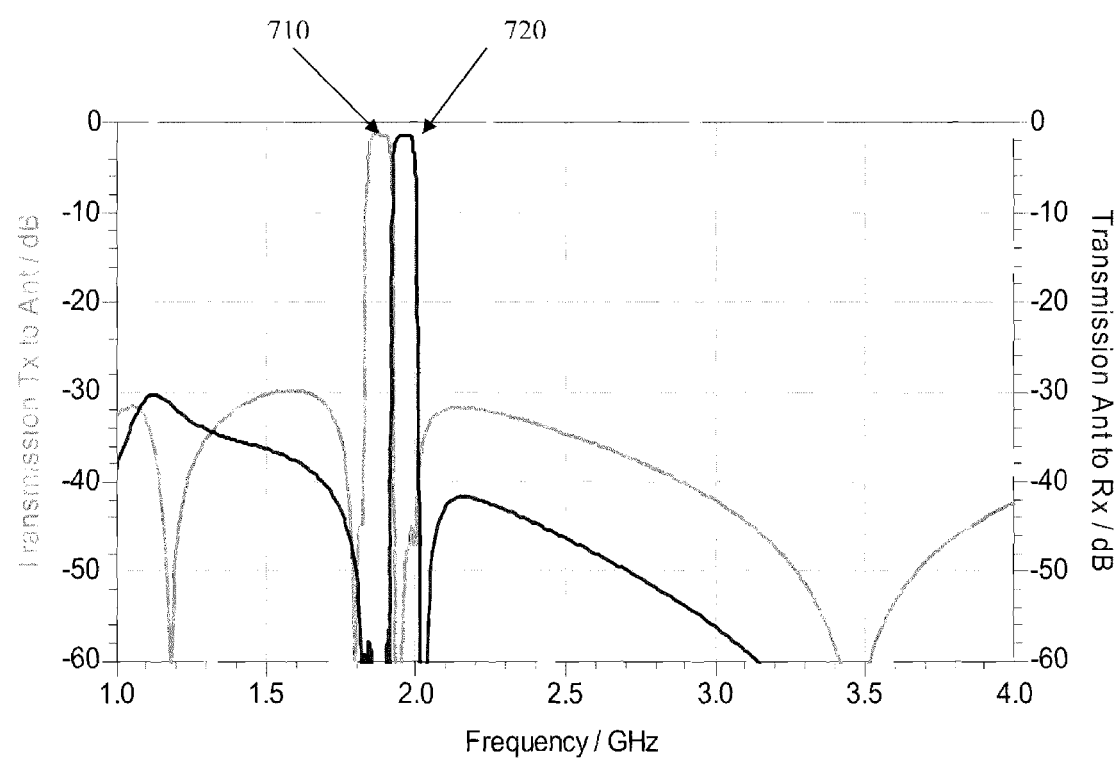
FIG. 7 is a diagram illustrating passband characteristics of receiver and transmitter branches of a duplexer, according to a representative embodiment.

FIG. 7 is a signal diagram illustrating pass-band characteristics, as well as out of band rejection, of the receive and transmit paths of the duplexer, according to a representative embodiment, where the transmitter and receiver are operating in UMTS Band 2, for example, with a transmit center frequency of about 1870 MHz and a receive center frequency of about 1950 MHz, respectively, as discussed above. Trace 710 in FIG. 7 shows representative frequency response of the transmit filter 420, and trace 720 shows representative frequency response of the receive filter 550, where the respective passbands are adjacent to one another.

FIGS. 6A, 6B and 7 correspond to an illustrative configuration of the duplexer 500 shown in FIG. 5. In the depicted configuration, the inductor 541 has a value of about 4.3 nH, the inductor 542 has a value of about 4.2 nH and the capacitor 543 has a value of about 1.6 pF. Also, the values of the inductors 561-562 may be between about 0.2 nH and 0.8 nH (typical wirebond values), and the values of the inductors 431-433 may be in the same range. Also, each of the resonators 421-428 and 551-558 may be an FBAR, as discussed above, having areas in the range of about 1000-100,000 square microns, for example, depending on the frequency and bandwidth requirements of the filters/duplexers and optimized impedance for each particular resonator. It is understood that, in various embodiments, the sizes and/or values of the resonators, inductors and capacitor may vary to provide unique benefits for any particular situation or to meet application specific design requirements of various implementations, as would be apparent to one skilled in the art.

Figure 8A:
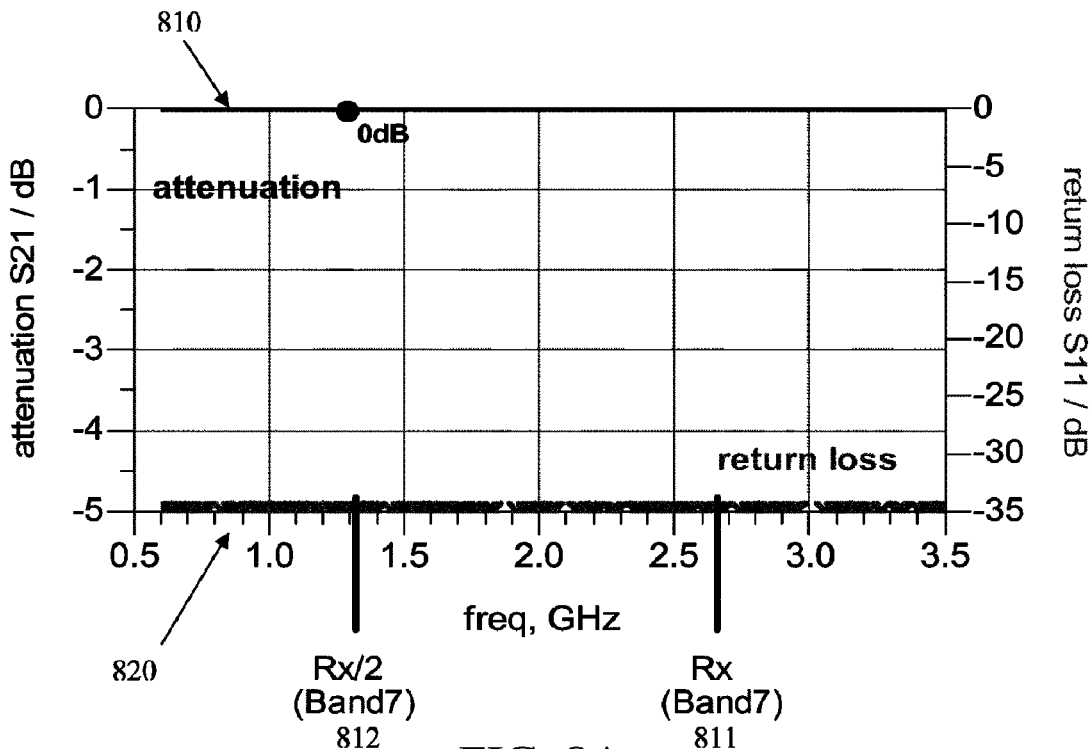
FIG. 8A is a diagram illustrating amplitude response of a conventional phase shifter in a duplexer.

FIG. 8A is a diagram illustrating amplitude response of a conventional phase shifter in a duplexer, where the phase shifter is a transmission line and where the transmitter and receiver are operating in UMTS Band 7, for example, with a receive center frequency of about 2655 MHz.

Referring to FIG. 8A, curve 810 shows amplitude response of the conventional transmission line connected between an antenna terminal and a receive filter as a function of forward transmission loss $S_{21}$ (in dB). Curve 820 shows return loss of the conventional transmission line connected between the antenna terminal and the receive filter as a function of the reflection coefficient $S_{11}$ (in dB) of the input of the receive filter. In the depicted example, the characteristic impedance Z0=50 Ohms and the electrical length E=90° at the receive center frequency. Points 811 and 812 indicate the center frequency (e.g., about 2655 MHz) and one half the center frequency (e.g., about 1327 MHz) of the receiver. As can be seen by curve 810 at the half center frequency point 812, the conventional transmission line provides no additional attenuation (0 dB) at low frequencies, other than typical line losses.

Figure 8B:
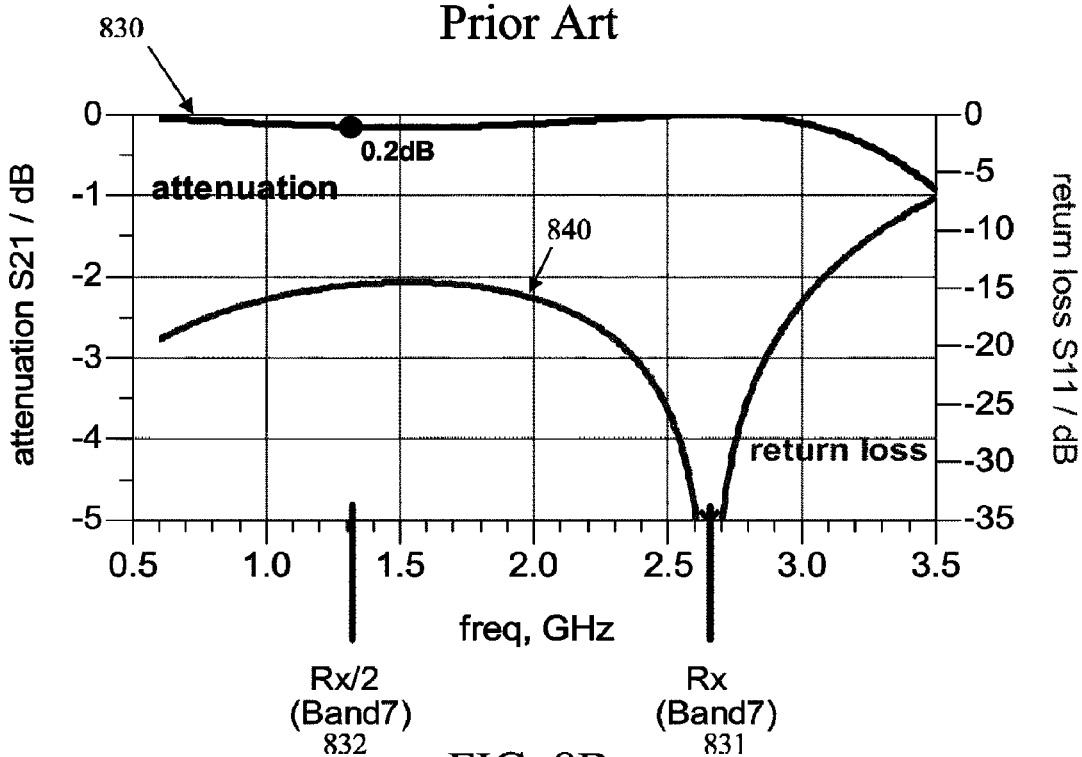
FIG. 8B is a diagram illustrating amplitude response of a conventional phase shifter in a duplexer.

Similarly, FIG. 8B is a diagram illustrating amplitude response of a conventional phase shifter in a duplexer, where the phase shifter is a Pi-circuit, having a series inductance connected between two shunt capacitances and where the transmitter and receiver are operating in UMTS Band 7, for example, with a receive center frequency of about 2655 MHz.

Referring to FIG. 8B, curve 830 shows amplitude response of the conventional Pi-circuit connected between an antenna terminal and a receive filter as a function of forward transmission loss $S_{21}$ (in dB). Curve 840 shows return loss of the conventional Pi-circuit connected between the antenna terminal and the receive filter as a function of the reflection coefficient $S_{11}$ (in dB) of the input of the receive filter. In the depicted example, the characteristic impedance Z0=50 Ohms and the electrical length E=90° at the receive center frequency. Points 831 and 832 indicate the center frequency (e.g., about 2655 MHz) and one half the center frequency (e.g., about 1327 MHz) of the receiver. As can be seen by curve 830 at the half center frequency point 832, the conventional Pi-circuit provides no appreciable attenuation (e.g., about 0.2 dB) at low frequencies.

Figure 9:
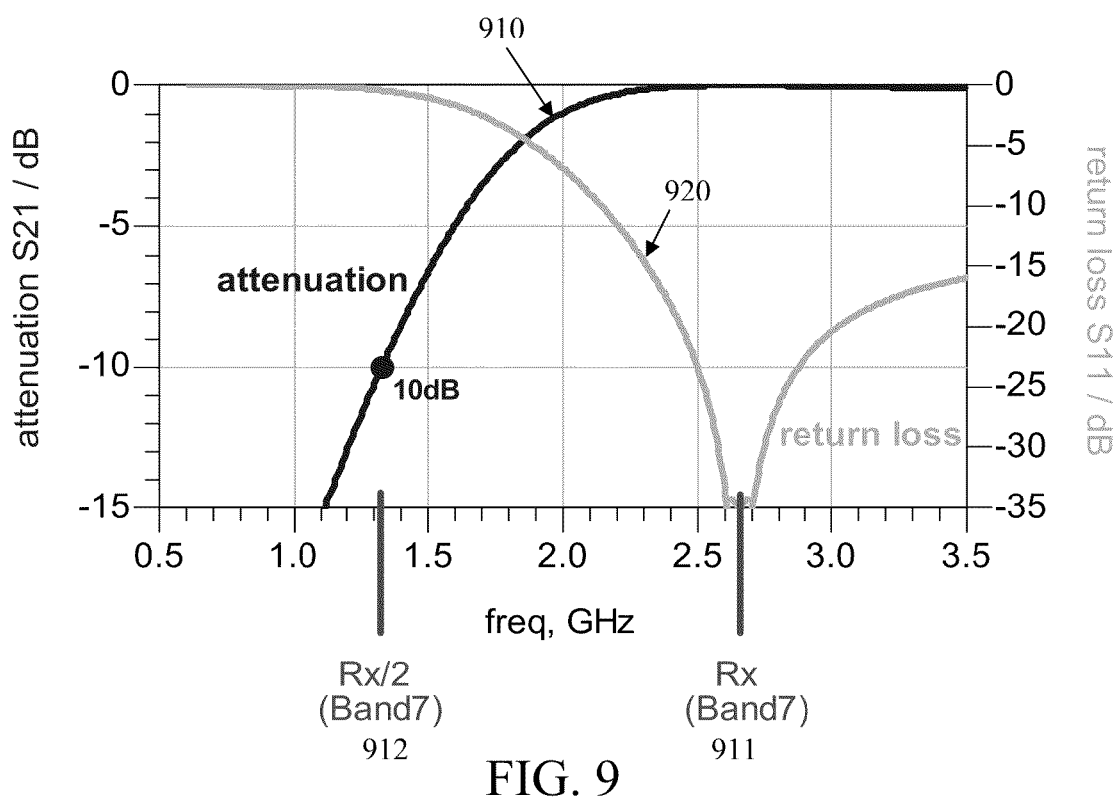
FIG. 9 is a diagram illustrating amplitude response of a of a phase shifter in a duplexer, according to a representative embodiment.

In comparison, FIG. 9 is a diagram illustrating amplitude response of a negative phase shifter in a duplexer, according to a representative embodiment, where the phase shifter is a modified Pi-circuit, having a series capacitances connected between two shunt inductances (e.g., phase shifters 240 and 540 shown in FIGS. 2 and 5, respectively). Again, for purposes of illustration, the transmitter and receiver are operating in UMTS Band 7, for example, with a receive center frequency of about 2655 MHz.

Referring to FIG. 9, curve 910 shows amplitude response of the phase shifter phase shifter 240, 540 connected between the antenna terminal 415 and the receive filter 550 as a function of forward transmission loss $S_{21}$ (in dB). Curve 920 shows return loss of the phase shifter 240, 540 connected between the antenna terminal 415 and the receive filter 550 as a function of the reflection coefficient $S_{11}$ (in dB) of the input of the receive filter 550. In the depicted example, the characteristic impedance Z0=50 Ohms and the electrical length E=−90° at the receive center frequency. Points 911 and 912 indicate the center frequency (e.g., about 2655 MHz) and one half the center frequency (e.g., about 1327 MHz) of the receiver. As can be seen by curve 910 at the half center frequency point 911, the phase shifter 240, 540 provides significant attenuation (e.g., about 10 dB) at low frequencies.

Notably, in the embodiment in which the phase shifter includes a modified T-circuit having a shunt inductance connected between series capacitances (e.g., phase shifter 340 shown in FIG. 3), the amplitude response of the receiver is about the same as that shown by curve 910 of FIG. 9.

The performance of the duplexers according to various embodiments discussed above is improved over conventional transmit and receive filters, as well as phase shifters and other transformation circuits. The phase shifters enable negative phase shifting of receive filters for impedance matching, while effectively reducing the length of transmission line between the receive filter and the common antenna node. The phase shifter configurations may be independent of the receive filter design (and the transmit filter design), simplifying design considerations for both, the matching circuits and the filters.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A duplexer interfacing a receiver and a transmitter with a common antenna, the duplexer comprising:
    a first acoustic filter connected in series between the antenna and the transmitter, the first acoustic filter having a first passband;
    a second acoustic filter connected in series between the antenna and the receiver, the second acoustic filter having a second passband; and
    a phase shifter comprising at least one series capacitor connected in series with the antenna and at least one shunt inductor connected between the at least one capacitor and ground,
    wherein the phase shifter is connected between the antenna and the first acoustic filter when the first passband is higher than the second passband, and provides a negative phase shift of an output impedance of the first acoustic filter, and
    wherein the phase shifter is connected between the antenna and the second acoustic filter when the second passband is higher than the first passband, and provides a negative phase shift of an input impedance of the second acoustic filter.

2. The duplexer of claim 1, wherein the first acoustic filter comprises a plurality of first series resonators connected in series between the antenna and the transmitter and a plurality of first shunt resonators respectively connected between at least one of the series resonators and ground; and
    wherein the second acoustic filter comprises a plurality of second series resonators connected in series between the antenna and the receiver and a plurality of second shunt resonators respectively connected between at least one of the second series resistors and the ground.

3. The duplexer of claim 2, wherein the second passband is higher than the first passband, and a resonator of the second acoustic filter located closest to the antenna is one of the plurality of second shunt resonators.

4. The duplexer of claim 2, wherein the second passband is higher than the first passband, and a resonator of the second acoustic filter located closest to the antenna is one of the plurality of second series resonators.

5. The duplexer of claim 1, wherein the second passband is higher than the first passband, and the phase shifter comprises at least one series capacitor connected between the antenna and the input of the second acoustic filter, and two shunt inductors connected between ground and each side of the series capacitor, respectively.

6. The duplexer of claim 1, wherein the second passband is higher than the first passband, and the phase shifter comprises at least two series capacitors connected between the antenna and the input of the second acoustic filter, and one shunt inductor connected between ground and each of the two series capacitors.

7. The duplexer of claim 1, wherein the first passband is higher than the second passband, and the phase shifter comprises at least one series capacitor connected between the antenna and the output of the first acoustic filter, and two shunt inductors connected between ground and each side of the series capacitor, respectively.

8. The duplexer of claim 1, wherein the first passband is higher than the second passband, and the phase shifter comprises at least two series capacitors connected between the antenna and the output of the first acoustic filter, and one shunt inductor connected between ground and each of the two series capacitors.

9. The duplexer of claim 2, wherein each of the first and second series resonators and the first and second shunt resonators comprises a film bulk acoustic resonator (FBAR) or a bulk acoustic wave (BAW) resonator device.

10. The duplexer of claim 1, wherein at least one of the series capacitor and the shunt inductor of the phase shifter is implemented within a die of the first acoustic filter or the second acoustic filter.

11. The duplexer of claim 1, wherein at least one of the series capacitor and the shunt inductor of the phase shifter is implemented on a silicon or polymer capping of the first acoustic filter or the second acoustic filter.

12. The duplexer of claim 2, wherein at least one of the series capacitor and the shunt inductor of the phase shifter is implemented on a common substrate with the first series resonators and the first shunt resonators of the first acoustic filter.

13. The duplexer of claim 2, wherein at least one of the series capacitor and the shunt inductor of the phase shifter is implemented on a common substrate with the second series resonators and the second shunt resonators of the second acoustic filter.

14. The duplexer of claim 2, wherein one of the series capacitor and the shunt inductor of the phase shifter is implemented on a common substrate with the first series resonators and the first shunt resonators of the first acoustic filter, and the other one of the series capacitor and the shunt inductor of the phase shifter is implemented on a common substrate with the second series resonators and the second shunt resonators of the second acoustic filter.

15. A duplexer, comprising:
a transmit filter connected in series between an antenna terminal and a transmitter terminal;
a receive filter connected in series between the antenna terminal and a receiver terminal, the receive filter having a higher passband center frequency than the transmit filter; and
a phase shifter connected in series between the antenna terminal and an input of the receive filter, the phase shifter comprising a capacitor connected in series between the antenna terminal and the input of the receive filter, a first inductor connected between a first end of the capacitor and ground, and a second inductor connected between a second end of the capacitor and ground, wherein the phase shifter provides a negative phase shift of an input impedance of the receive filter.

16. The duplexer of claim 15, wherein the receive filter comprises a plurality of series resonators connected in series between the antenna terminal and the receiver terminal, and a plurality of shunt resonators respectively connected between at least one of the series resistors and ground.

17. The duplexer of claim 16, wherein at least one of the capacitor, the first inductor and second inductor of the phase shifter is implemented on a common substrate with the series resonators and the shunt resonators of the receive filter.

18. A duplexer, comprising:
a transmit filter connected in series between an antenna terminal and a transmitter terminal;
a receive filter connected in series between the antenna terminal and a receiver terminal, the receive filter having a higher passband center frequency than the transmit filter; and
a phase shifter connected in series between the antenna terminal and an input of the receive filter, the phase shifter comprising first and second capacitors connected in series between the antenna terminal and the input of the receive filter, and one shunt inductor having a first end connected between the first and second series capacitors and a second end connected to a ground voltage, wherein the phase shifter provides a negative phase shift of an input impedance of the receive filter.

19. The duplexer of claim 18, wherein the receive filter comprises a plurality of series resonators connected in series between the antenna terminal and the receiver terminal, and a plurality of shunt resonators respectively connected between at least one of the series resistors and the ground voltage.

20. The duplexer of claim 19, wherein at least one of the first capacitor, the second capacitor and the inductor of the phase shifter is implemented on a common substrate with the series resonators and the shunt resonators of the receive filter.

* * * * *